United States Patent
Brynielsson

(10) Patent No.: US 6,556,900 B1
(45) Date of Patent: Apr. 29, 2003

(54) METHOD AND DEVICE IN VEHICLE CONTROL SYSTEM, AND SYSTEM FOR ERROR DIAGNOSTICS IN VEHICLE

(75) Inventor: Thore Brynielsson, Kullavik (SE)

(73) Assignee: Thoreb AB, Vastra Frolunda (SE)

( * ) Notice: Subject to any disclaimer, the term of this patent is extended or adjusted under 35 U.S.C. 154(b) by 0 days.

(21) Appl. No.: 09/869,642

(22) PCT Filed: Jan. 28, 2000

(86) PCT No.: PCT/SE00/00169
§ 371 (c)(1),
(2), (4) Date: Aug. 28, 2001

(87) PCT Pub. No.: WO00/47885
PCT Pub. Date: Aug. 17, 2000

(30) Foreign Application Priority Data

Jan. 28, 1999 (SE) ............................................... 9900268

(51) Int. Cl.⁷ ............................ G06F 7/00; G06F 19/00
(52) U.S. Cl. ............................ 701/29; 701/30; 701/33; 701/34; 701/31; 701/43; 701/76; 340/825.54; 340/825.52; 73/146.5
(58) Field of Search .......................... 701/29, 31, 33, 701/30, 34, 43, 76, 93, 63, 35, 101; 123/399; 340/825.54, 825.52, 426, 438, 425.5; 307/10.1; 73/141.5

(56) References Cited

U.S. PATENT DOCUMENTS

| 4,989,146 A | 1/1991 | Imajo ......................... 340/635 |
| 5,590,040 A | 12/1996 | Abe et al. .................... 340/438 |
| 5,706,782 A | * 1/1998 | Kurihara ..................... 123/399 |
| 6,134,488 A | * 10/2000 | Sasaki et al. ................. 701/31 |

FOREIGN PATENT DOCUMENTS

EP A2685723 12/1996

* cited by examiner

Primary Examiner—Thomas G. Black
Assistant Examiner—Tuan C To
(74) Attorney, Agent, or Firm—Birch, Stewart, Kolasch & Birch, LLP

(57) ABSTRACT

The invention relates to a method of storing information in the form of signals from a control system in a vehicle, said method comprising the step of reading a signal on recurrent sampling occasions and increasing the value of a counter which represents a signal value interval. The method further comprises the steps of measuring on each sampling occasion a change of the signal in relation to a previous signal value, comparing change with the threshold value, and, if the change is greater than the threshold value, increasing the value of a counter associated with this threshold value.

19 Claims, 5 Drawing Sheets

METHOD AND DEVICE IN VEHICLE CONTROL SYSTEM, AND SYSTEM FOR ERROR DIAGNOSTICS IN VEHICLE

This application is the national phase under 35 U.S.C. §371 of PCT International Application No. PCT/SE00/00169 which has an International filing date of Jan. 28, 2000, which designated the United States of America and was published in English.

TECHNICAL FIELD

The present invention relates to a method of storing information in the form of signals from a control system in a vehicle, counters being used to record on repeated occasions within which interval a signal is situated.

The invention also relates to a method, a device and a system for diagnosing errors and maintenance of vehicles.

TECHNICAL BACKGROUND

To handle the communication between various systems in a bus or a tram, it is known to use a system with a plurality of control or computer units which communicate via a communication channel (data bus). Each unit has a plurality of input and output terminals and wired logic to decide on available information at each separate moment and act accordingly. The system can receive information from a plurality of transducers, which generate signals representing different conditions in the vehicle, for instance, the temperature of the motor oil or if a door is open.

In order to diagnose the vehicle and detect errors, it is known to carry out an extensive analysis of the system at regular intervals, for instance, once a day. To carry out this analysis, a separate computer can be connected to one or more units of the control system and read the signals from one or more of the transducers in the system. This information gives a satisfactory on-the-spot account of the condition of the vehicle. For instance, information is provided concerning possible erroneous voltage levels which may be present in a component or a transducer.

If an analysis of this type suggests that a part of the different subsystems of the vehicle produces strange values or values indicating an error, the error may with any luck be rectified. It is, however, often necessary to carry out a more extensive analysis, in which measuring values from one or more transducers are measured and logged when driving for a whole day. When logging, the transducer signals are sampled and stored in a memory unit connected to the system.

In order to identify an error, it may be necessary to log several signals during the whole day. Since this results in very large quantities of data, they will be difficult to handle as concerns storage and communication, and therefore the measuring and analysis is a complicated and expensive process.

In order to store information from transducers in a storage-saving manner, it is known from U.S. Pat. No. 5,590,040 to use counters, which each represent an interval of the signal value of the transducer. The device according to this document determines to which value interval each sampling value belongs and increases the value of the counter in question.

One problem of this technique is that much information is lost. In principle, the counters can only reveal whether a measured value has once been located within an erroneous interval. Signal values which represent completely unphysical processes, i.e. processes which do not correspond to the physical reality and therefore indicate errors in, for instance, a component or a subsystem, may seem to be completely normal in such a limited representation, as long as they are situated within normal value intervals.

FIG. 1 shows how the method which is described in U.S. Pat. No. 5,590,040 generates substantially identical representations of two completely different series of measurements. The measuring signals in the series could, for instance, represent the number of revolutions or the temperature of the oil. In the first series (FIG. 1a) an even increase of the voltage of the signal from 0 to 4 volt takes place. A division of the measured values into four intervals and an incrementation of counters associated with each interval would result in all four counters assuming substantially the same value since the signal has been situated for an approximately equally long period of time in each interval. In the second series, the signal is instead very unstable and fluctuates significantly during the increase (FIG. 1b). On average, the distribution of measured values is, however, relatively even, and the signal is situated for an approximately equally long period of time in each interval. Thus, the values of the five counters would not differ materially from those of the counters recording the signal in FIG. 1a.

The series of measurements in FIG. 1b could perfectly well indicate an error, for instance, in a transducer, a cord or the underlying physical process. This error is probably not detected using a method according to U.S. Pat. No. 5,590,040.

Furthermore, the device and the method according to U.S. Pat. No. 5,590,040 are primarily intended to reveal how an error occurred at the moment of occurrence. Thus, they cannot be used to prevent errors.

In systems of the above-mentioned type, an enormous quantity of data is, as already mentioned, available at each moment. It would be convenient if this information could be used with a view to preventing errors, instead of only indicating errors.

SUMMARY OF THE INVENTION

A first object of the present invention is to store data from a control system in a vehicle in a memory-saving manner.

A second object of the present invention is to store data in such manner that a sufficient amount of information is available for a satisfactory error detection and error diagnostics.

A third object of the present invention is to store data in such manner that a sufficient amount of information is available to prevent errors before they arise or at least detect an error before it has managed to attain such proportions so as to be of any practical relevance.

These and other objects are achieved by a method according to claim 1. According to the method, use is made of change counters to record if a change in a signal value is greater than a defined change threshold value.

In this connection, change generally refers to the relation between a sampling value and previous sampling values. According to a preferred embodiment, the change consists of a difference between two sampling values and thus represents a derivative of the signal. It is, of course, also possible according to the method to use other change values, for instance, the divergence between two differences, which represents the second derivative of the signal.

By storing data according to the invention, a compact data set is provided, which contains great quantities of information about the condition of the system during a predetermined period of time. A data series of tens of thousands of values may be stored with a limited number of counters. Each counter only needs to handle integers, thus requiring little storage capacity.

Thus, the method according to the invention makes it possible to handle data in a fast and simple manner, said data representing large quantities of information about the condition of a vehicle during, for instance, a whole day. Therefore, information can be stored continuously in a vehicle without requiring extensive equipment.

Furthermore, the method of storing information, in which value interval counters and change counters are used, ensures that the information, in spite of its compact form, still contains a large amount of information. The structure in which the information is stored is also very well suited for analysis of the condition of the vehicle.

For instance, the physical process which a measuring signal represents can be determined to have a rate of change in time which is limited to a predetermined interval. According to the method, a change threshold value is associated which defines this predetermined interval with a counter. If this counter is incremented during a period, this immediately indicates that something is wrong. This may be due to a number of reasons, for instance, the facts that the transducer generates erroneous measuring signals, that there is a loose contact in a cord or that he physical process is disturbed. It is to be noted that the signal level in itself does not necessarily indicate an error, and therefore value interval counters would not alone be able to ensure that the error is detected.

In this connection, the word "error" does not only refer to errors of the kind that immediately needs correction, but also to errors which only occur for a short moment or which have not yet attained any practical relevance. By means of information storage according to the invention, these errors can be detected and taken care of in a suitable manner, for instance, by an additional service measure so that the error will not increase. Thus, the invention permits an improved maintenance of the vehicle.

One example of the use of information storage according to the invention is the recording of speed. Storage using merely value interval counters only indicates for how long the vehicle has been driven at a speed within predetermined intervals. Change counters contribute information about how the speed has changed, for instance, if an acceleration or a retardation has exceeded a certain threshold value or is situated within certain predefined intervals. This information indicates to what extent the driving has been jerky and suitable measures may be taken to promote smoother driving, for instance, training of drivers, reward systems, etc.

According to one aspect of the method according to the invention, at least two threshold values are defined for at least one direction of change and, if the change in the direction of change is situated between two threshold values, the value of a counter associated with this interval is increased. In this manner, intervals are generated also for changes, which contributes to making the information usable.

According to a further aspect of the method according to the invention, several sets of counters are defined and associated with various phases of the operation of the vehicle. Possible examples of such phases are initiation, start-up of the engine, running the engine hot, and normal operation. This grouping of the counters contributes to making the information usable.

Furthermore, the invention relates to a device for storing data from a control system in a vehicle according to claim 9.

The sampling means and the processing means preferably consist of at least one processor programmed for the purpose. The device according to the invention can thus be realised in an existing control system by providing the existing system with new software with functionality according to the present invention.

According to one aspect of the invention, the device comprises several sampling means, storage means and processing means, which communicate via a communication channel with a processing unit. The information which is stored about each signal in the control system can then be read and analysed by the processing unit.

According to yet another aspect of the invention, the processing unit comprises a database, which stores information intended to be compared with the values which are read from each counter. Preferably, the database is arranged to be continuously updated with the values which are read from the control system. The structure according to which the information is stored is well suited for numerical analysis.

According to a further aspect of the invention, the processing unit is external in relation to the vehicle. As a result, the unit can be shared by several vehicles. The transmission can take place continuously or on recurrent occasions, for instance, every day or each time the vehicle runs idle.

Furthermore, the invention relates to a system for diagnosing errors in vehicles according to claim 16. The system comprises a plurality of vehicles which are provided with devices according to the invention and which are arranged to communicate information via a communication channel to a shared processing unit which is arranged to read the value of each counter to thereby detect errors or error tendencies in the vehicle.

The memory-saving storage of information from the control systems in the vehicles permits a fast transmission of data from the respective vehicles to the processing unit, and the information is also of such character that it can be analysed quickly. As a result, a great number of vehicles can be connected to the system without making the transmission or the processing excessively time-consuming.

With many vehicles, a database of considerable size can be built on the basis of the information which is transferred from the control systems in the vehicles. This database can then be used not only to detect errors which have occurred or which will soon occur, but also to predict errors in the long term. The processing unit can be taught to "recognise" recurrent patterns in the information and thus predict what might happen.

According to another aspect of the system according to the invention, the processing unit is arranged to communicate information via the communication channel back to the vehicles. By this means, it is possible, in the case of an identification of an error in a vehicle, to communicate this to the vehicle in question so that, for instance, the driver will be able to take appropriate measures. It goes without saying that the information could also be communicated to a co-ordination unit or repair shop where appropriate measures can be taken.

BRIEF DESCRIPTION OF THE DRAWINGS

Currently preferred embodiments of the present invention will now be described in more detail with reference to the accompanying drawings.

DESCRIPTION OF PREFERRED EMBODIMENTS

Figure 2:
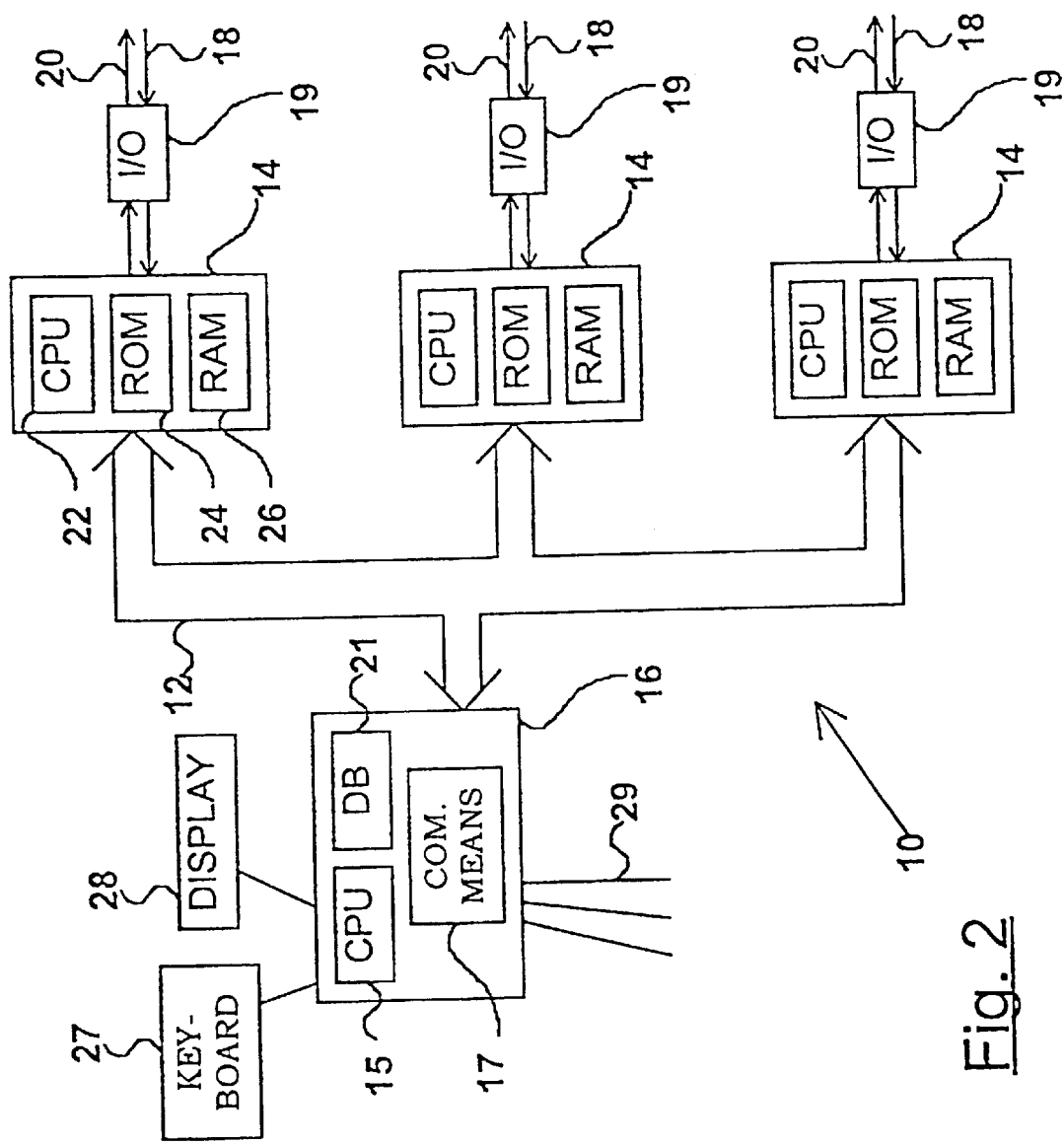
FIG. 2 is a block diagram of a control system in a vehicle.

Today, it is common to arrange electronic control systems in utility vehicles, such as buses, trams, lorries, etc. These control systems may consist of a plurality of components, which are interconnected via a communication channel. One example of such a system 10 is the Applicant's own ELSY system, which is schematically shown in FIG. 2.

In this case, the communication channel is a serial communication bus 12, which interconnects a plurality of communication nodes 14 and, whenever applicable, a vehicle computer 16.

One or more analogue or digital transducers (not shown) may be connected to each communication node 14, said transducers providing the communication node 14 with input signals 18 via an input/output port 19 from the engine system, air-conditioning system, instruments, doors, etc. Analogue input signals normally consist of voltage levels representing a measured physical quantity, for instance, the temperature of the engine. Digital input signals indicate, for instance, whether a door is open or closed.

Furthermore, each communication node 14 can control, by means of output signals 20 via the input/output port 19, one or more objects (not shown), such as lamps, fans, solenoid valves, etc.

The current signals 18, 20 are known, via the communication bus 12, by all nodes 14 in the system as well as by the vehicle computer 16.

Each communication node 14 is provided with a processor 22 which is arranged to decide, on the basis of the current input and output signals 18, 20 in the system 10, whether a determined object is to be connected to voltage or not. The processor then uses conditions which have been stored, for instance, in a flash memory or a ROM 24 in the communication node, said conditions consisting of logical relations between various input signals.

The vehicle computer 16 is the control unit of the system and provided with a keyboard 27 and a display 28 for communication with the driver or some other operator.

Furthermore, the vehicle computer can be connected, via serial data channels 29, to external equipment (not shown), such as ticket machines, displays showing the destination, data radio, etc. The serial data channels can have an optional interface, for instance RS232, RS422, IBIS or CAN.

According to the invention, the processor 22 in each communication node is further arranged to continuously store information about the values of the input signals and output signals in a RAM 26.

Figure 1A:
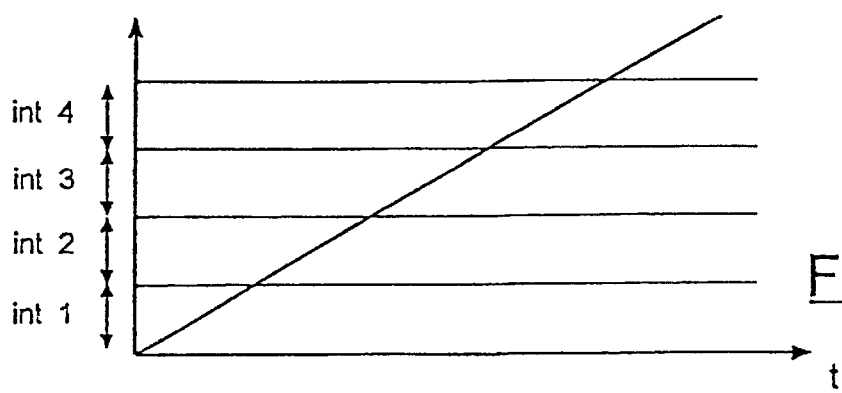
FIGS. 1a and 1b are two diagrams showing a signal value as a function of time.
Figure 1B:
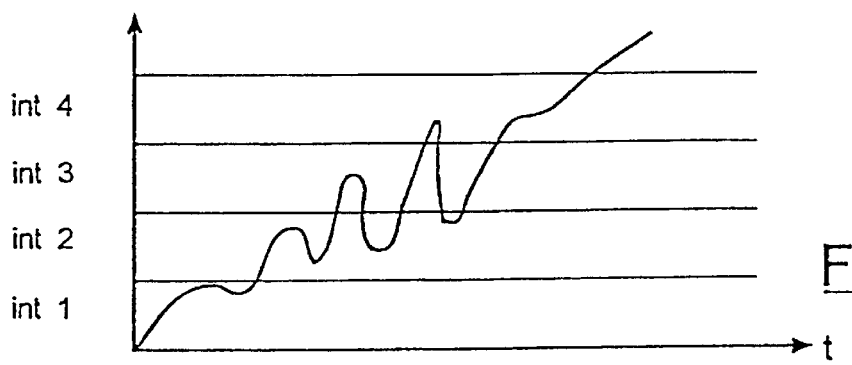
Figure 5A:
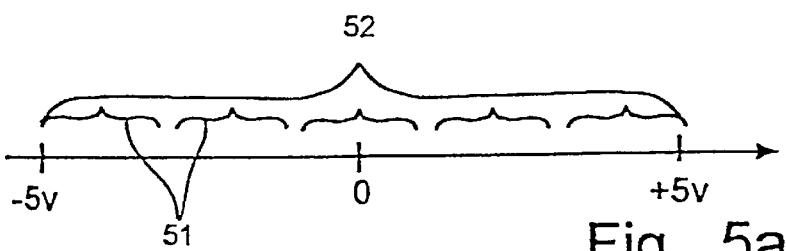
FIG. 5a is a schematic division of an axis of values into value intervals.
Figure 5B:
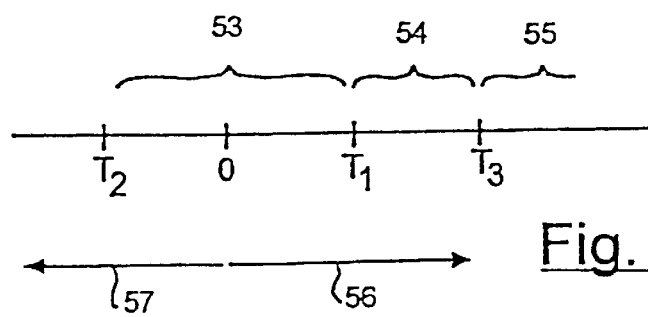
FIG. 5b shows a plurality of threshold values on an axis of values.
Figure 3:
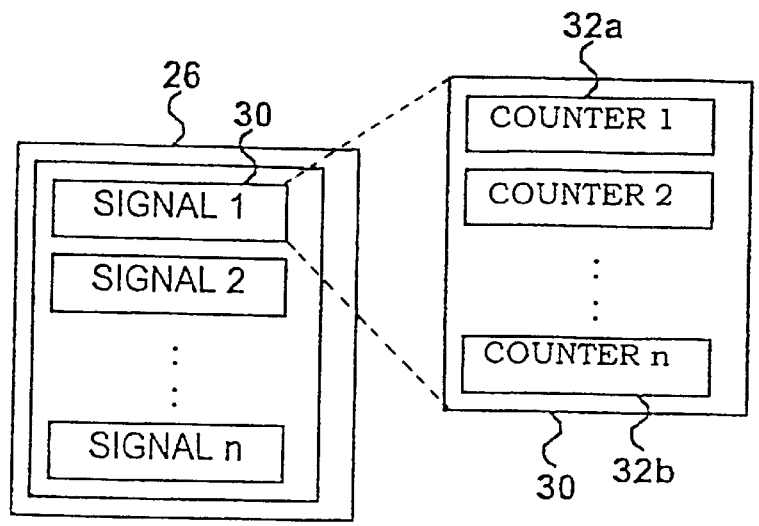
FIG. 3 is block diagram of the RAM in a communication node according to FIG. 2.
Figure 4:
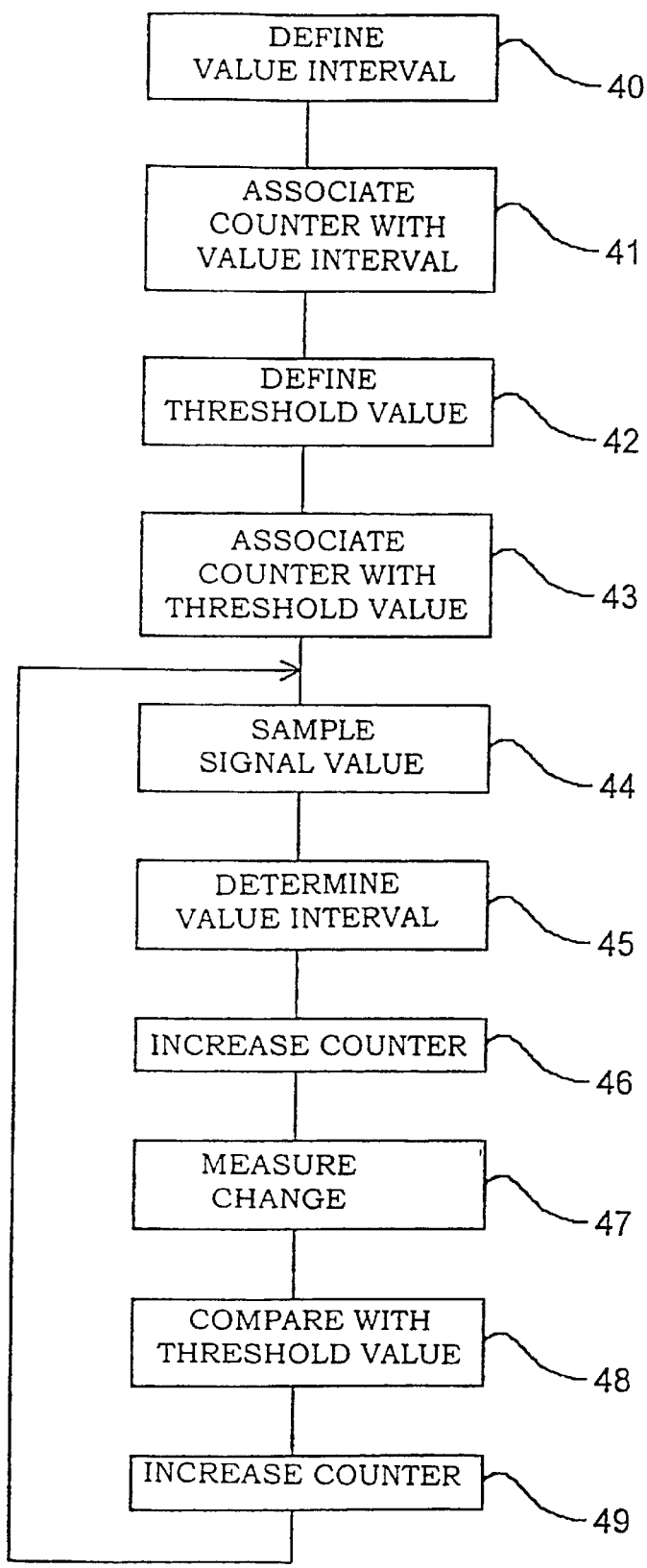
FIG. 4 is a flow diagram showing the method according to the invention.

As shown in FIG. 3, the RAM 26 in each communication node 14 is divided for this purpose into a plurality of areas 30, each representing a predetermined input or output signal 18, 20. Each area is further divided into a plurality of counters 32a, 32b. In the flash memory/ROM 24, software is stored, which contains instructions to the processor so that the processor increases the value of the counters 32a, 32b according to a method which is shown in FIG. 4. The steps 40–49, which are shown in FIG. 4, relate to one signal 18, 20, but it is preferred that each processor 22 be arranged to sample several signals 18, 20 and administer several storage areas 30. In the description below of the method, reference is also made to FIGS. 5a and 5b.

First, a number of value intervals 51 are defined (step 40) and associated (step 41) with a respective counter 32a. The value intervals 51 are intended to represent subintervals of the interval 52 within which the signal in question can be expected to be situated. Depending on the desired degree of accuracy, the number of intervals which are defined for a signal can vary. The more intervals, the more accurate the information which is stored by means of the counters 32a, but at the same time more RAM storage capacity is needed.

Subsequently (step 42), for at least one direction of change 56, 57 at least one change threshold value $T_1$, $T_2$ is defined which is associated (step 43) with a change counter 32b. In this connection, direction of change 56, 57 refers to a suitable mathematical definition of possible changes, in the simplest case a positive 56 or negative 57 change of a scalar quantity and in more complicated cases vectorial directions of change of a multidimensional quantity.

Value intervals 51 and threshold values $T_1$, $T_2$ can be predefined in the software which is stored in the memory 24. Alternatively, they can be defined as a function of the sampled signal values and thus be dynamic. If needed, information about the value interval and the threshold value, respectively, which is associated with a certain counter can be stored in the RAM 26.

In step 44, a signal 18, 20 is sampled and a signal value is obtained in the RAM 26. The processor 22 decides (step 45) within which value interval 51 the signal value is located and the corresponding counter 32a is increased by one (step 46). Steps 45 and 46 can be implemented by means of a program code elementary to the one skilled in the art.

Subsequently, in step 47 the processor 22 measures a change of the signal in relation to a previous signal value. In step 48, the processor decides whether the measured change is greater than the threshold value of a direction of change 56, 57 and, if that is the case, increases the counter 32b which is associated with the threshold value in question (step 49). The program control then reverts to step 44.

By having two change threshold values $T_1$, $T_2$, each counter 32b thus represents an open interval 58, 59 in a direction of change 56, 57 counted from the threshold values $T_1$, $T_2$. According to one embodiment, one change threshold value $T_1$ is greater than zero and represents increases and one change threshold value $T_2$ is less than zero and represents decreases. These threshold values then define an interval 53 and changes outside this interval are recorded as increases of counter values. The interval 53 can represent changes which are considered as normal for the signal.

According to another embodiment of the invention, only one threshold value is defined and compared with the absolute value of the measured change.

According to a further embodiment of the invention, at least two threshold values $T_1$, $T_3$ are defined in at least one direction of change 56, 57, which threshold values define an interval 54. In this case, a counter is associated with the interval 54 and a counter is associated with the open interval 55. The number of threshold values as well as the number of value intervals 51 can, of course, vary for different signals, more values yielding a better degree of resolution of the information about changes of a signal.

Figure 6:
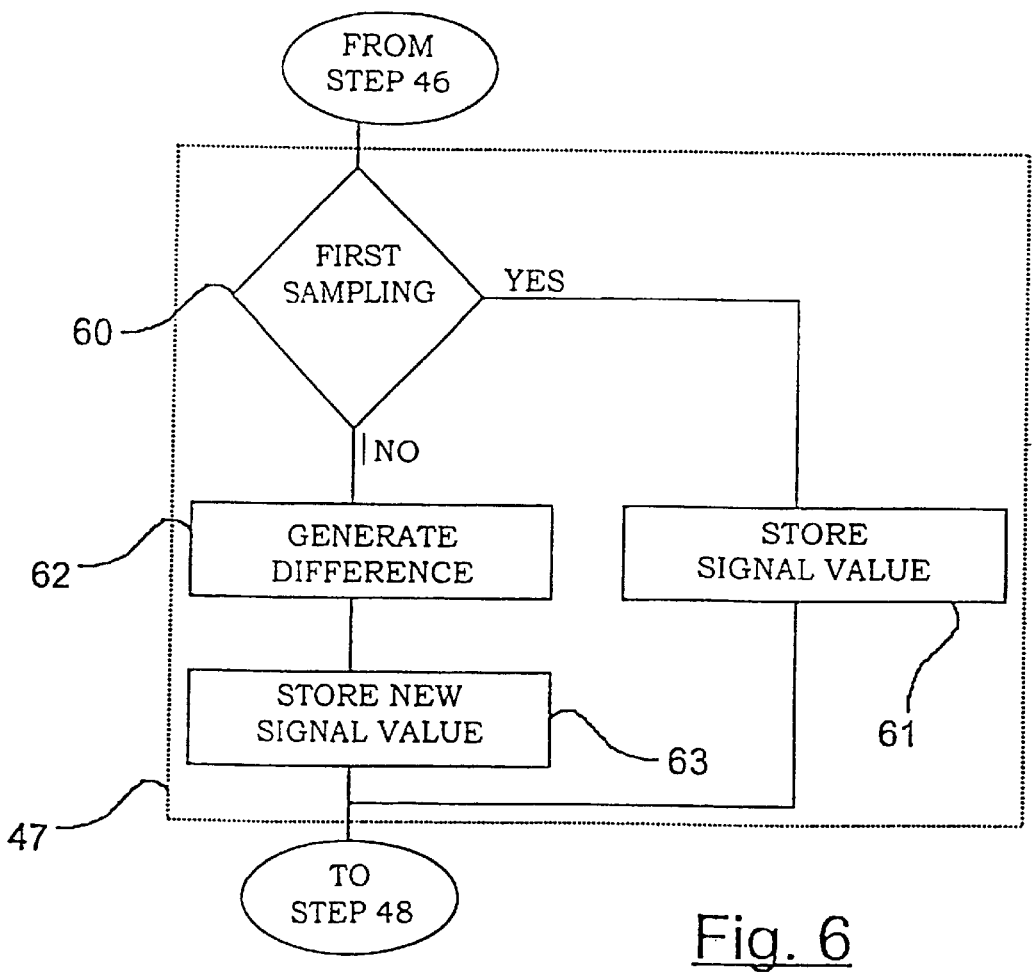
FIG. 6 is a flow diagram of the measuring of changes in FIG. 4.

FIG. 6 is a flow diagram showing how the step 47 of measuring a change of a signal can be realised.

In step 60, it is determined whether the sampling in question is the first one. If this is the case, the processor 22 stores (step 61) a first signal value in the RAM 26. Then the program control reverts to step 48 in FIG. 4.

Subsequently, i.e. on the next and on all subsequent sampling occasions, the program control will continue from step 60 to step 62, in which the processor 22 generates the difference between the last measured signal value and the stored signal value. After that (step 63), the stored signal value is replaced by the other signal value, and the program control reverts to step 48 in FIG. 4.

In the above-mentioned description of the direction of change and the change threshold value and in the flow diagram shown in FIG. 6, the measured change is thus a difference between signal values, which difference can be said to represent the derivative of the condition. It is, of course, also possible to let the change consist of a more complicated function of previous sampling values. For instance, the divergence between two successive differences could be calculated, which divergence represents the second derivative of the condition. The change threshold values could then, in a corresponding manner, represent threshold values of normal or expected diferential divergences.

Preferably, the counters 32a, 32b are grouped to store information about the signals of the system 10 during different phases of the operation of the vehicle. Examples of such phases could be initiation (power on), starting-up of the engine, warming-up phase, and normal operation, but a number of other variants are, of course, possible. This division of counters into groups makes it possible to define different change threshold values for different phases, which contributes to making the information usable. A process which is completely normal during start-up may be an indication of a serious fault if it occurs during normal operation, etc.

According to one embodiment of the invention, a processing unit, for instance the vehicle computer 16, is arranged to have the capacity of reading, via the communication bus 12, the value of each counter. A processor is then programmed to decide, according to predetermined conditions, whether the value of a counter, alone or in combination with other counter values, indicates that an error has occurred in the vehicle.

An example of such an error could be that a signal has shown changes which are greater than a threshold value which represents accepted changes. Thus, the signal has changed more per time unit than what is considered as normal.

Another example could be that counters which represent high values of the engine rotational speed have considerably higher values than counters representing high throttle values. This may indicate racing of the engine without this being initiated by the driver.

In order to identify patterns in the values of the counters which indicate errors of various types, a database 21 can be stored in the vehicle computer 16, and the processor 15 can be arranged to compare current counter values with the database 21.

The vehicle computer 16 or a communication node 14 can be arranged to immediately transmit information, under certain conditions, for instance when a predetermined threshold value is exceeded, for instance to the driver or to a responsible technician via external communication. Thus, suitable measures can be taken to repair the error or the error tendency.

Figure 7:
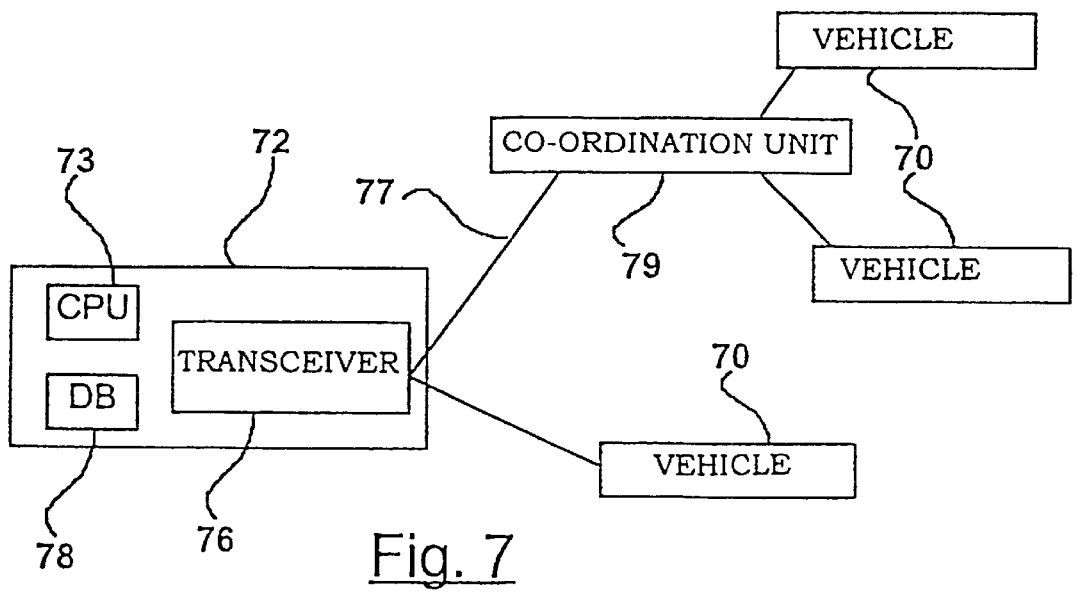
FIG. 7 is a block diagram of a system for diagnosing errors according to the present invention.

According to a further embodiment of the invention, the vehicle computer 16 or a communication node 14 is arranged to communicate information, via communication means 17 or 19, to a processing unit 72 which is external in relation to the vehicle 70, such as schematically shown in FIG. 7.

In a system for diagnosing errors in vehicles according to the invention, the processing unit 72 can receive information from a plurality of vehicles 70, for instance, all vehicles in local traffic in a city. Alternatively, vehicles from several different places, and even several different countries, can be arranged to communicate with one and the same processing unit 72.

The processing unit 72 is provided with communication means 76 for receiving data from each vehicle 70. The data transmission can take place in many different ways, for instance by radio communication or telecommunication 77, and use an optional communication protocol.

According to a method which is preferred by the Applicant, data are communicated via a radio communication from a number of vehicles to a co-ordination unit 79 and the Internet and TCP/IP communication are used between the co-ordination unit and the processing unit. The co-ordination unit 79 and the processing unit 72, respectively, then suitably comprise means 73 which are arranged in prior-art manner to handle TCP/IP communication as well as transceivers 76 which are arranged in prior-art manner to establish a TCP/IP contact between the units. It goes without saying that alternatively all communication may take place by means of TCP/IP communication.

Figure 8:
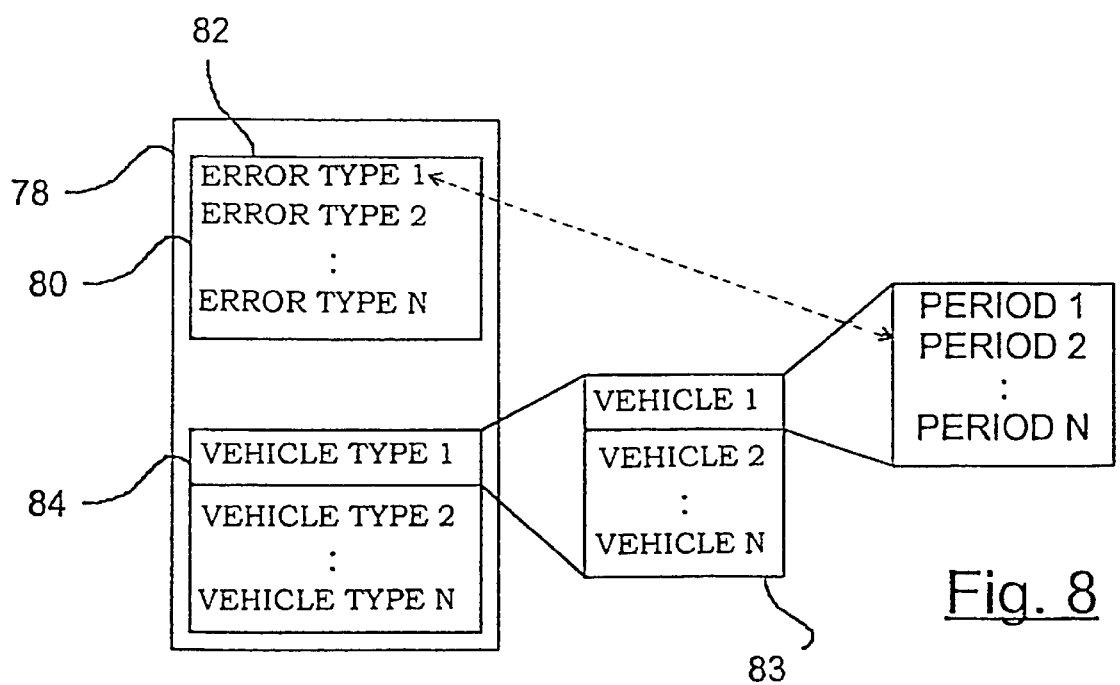
FIG. 8 is a block diagram of a database in the processing unit according to FIG. 7.

According to one embodiment of the system according S to the invention, the processing unit 72 receives information from a plurality of different vehicles at recurrent points of time, for instance, every day. This information is stored in a database 78 in the processing unit 72, for instance, on a hard disk or a corresponding storage unit. For each vehicle, information is stored in the database 78 concerning, on the one hand, the condition of the vehicle and, on the other, the errors which have occurred (see FIG. 8).

The information is structured such that similar errors are gathered in a register 80, so that it is possible to obtain from the database information about a given error type 82 from a great number of vehicles 83, in which the error in question has occurred. Furthermore, the information in the database 78 can be divided, for instance, depending on the type of vehicle 84.

Moreover, the processor 73 of the processing unit 72 is arranged to carry out analyses, by means of software intended for this purpose, of the stored information, for instance various forms of numerical analyses, to detect imminent errors in a given vehicle.

It will be understood that a number of variations of the above-described embodiments are possible within the scope of the inventive idea which is presented in the appended claims.

Thus, the positioning and interconnections of the units included in the system are not limited to that stated above. Both simpler and more complicated systems of software and hardware may be used, depending on the circumstances.

The above-mentioned co-ordination unit can, for instance, be excluded, in which case the vehicle may be arranged to communicate directly with a processing unit, for instance, by means of TCP/IP communication.

What is claimed is:

1. A method of storing information in the form of signals from a control system in a vehicle, comprising:

reading a signal on recurrent sampling occasions, and thereby obtaining a signal value;

defining for at least one direction of change of the signal at least one threshold value;

measuring on each sampling occasion a signal change in said direction of change by comparing a current signal value with a previous signal value;

comparing said signal change with said threshold value; and if said signal change is greater than said threshold value, increasing the value of a counter associated with said threshold value.

2. The method as claimed in claim 1, wherein at least two threshold values are defined for said direction of change and, if said signal change is situated between two threshold values, the value of a counter associated with this interval is increased.

3. The method as claimed in any one of claims 1 or 2, wherein said signal change consists of a difference between two signal values.

4. The method as claimed in any one of claims 1 or 2, wherein said signal change consists of a divergence between two signal value differences.

5. The method as claimed in any one of claims 1 or 2, wherein the step of measuring a change of the signal comprises:

storing a first signal value on a first sampling occasion in a temporary storage unit;

measuring a second signal value on a second sampling occasion, generating a difference between the second signal value and the stored signal value, said difference constituting said signal change; and replacing the stored signal value by the second signal value.

6. The method as claimed in claim 1, wherein several sets of counters are defined and associated with different phases of the operation of the vehicle.

7. The method as claimed in claim 1, wherein the values of said counters are communicated to a processing unit, said processing unit analysing said values to thereby discover and predict errors in the vehicle.

8. The method as claimed in claim 1, wherein the values of said counters are communicated to a processing unit, said processing unit analysing said values to thereby better adapt service measures to the vehicle.

9. The method according to claim 1, further comprising the steps of:

defining a plurality of value intervals, identifying to which value interval said signal value belongs; and increasing the value of a counter associated with said value interval.

10. A device for storing information from a control system in a vehicle, said control system comprising at least one transducer means arranged to generate a signal which represents a state of a physical quantity, said device comprising:

sampling means for reading the signal at recurrent sampling intervals and thereby repeatedly obtaining a signal value;

a counter associated with a threshold value defined for at least one direction of change; and processing means arranged to measure at each sampling interval a signal change in said direction of change, and, if the signal change is greater than said threshold value, to increase the value of the counter associated with said threshold value.

11. The device as claimed in claim 10, wherein the counters consist of storage areas in a memory means.

12. The device as claimed in claim 10, wherein the sampling means and the processing means consist of at least one processor programmed for the purpose.

13. A device as claimed in claim 10, wherein the device comprises a plurality of sampling means and a plurality of processing means, said plurality of sampling means and said plurality of processing means being arranged to communicate information via a communication channel to a shared processing unit, said processing unit being arranged to read the value of each counter to thereby detect errors in the vehicle.

14. The device as claimed in claim 13, wherein the processing unit comprises a database, said database storing information intended to be compared with the values read from each counter.

15. The device as claimed in claim 14, wherein the database is arranged to be continuously updated with the read values.

16. The device as claimed in claim 10, wherein the processing unit is external in relation to the vehicle.

17. The system for diagnosing errors in vehicles, comprising a plurality of vehicles provided with devices according claim 10, said vehicles being arranged to communicate information via a communication channel to a shared processing unit, said processing unit being arranged to read the value of each counter to thereby detect errors in the vehicle.

18. The system as claimed in claim 17, wherein the processing unit is arranged to communicate information via the communication channel back to the vehicles or to a service unit.

19. The device according to claim 10, further comprising:

a plurality of counters associated with predefined value intervals; and processing means arranged to determine to which predefined value interval a signal value belongs, and to increase the value of the counter associated with this interval.

* * * * *